(12) United States Patent
Avital et al.

(10) Patent No.: US 10,699,776 B1
(45) Date of Patent: Jun. 30, 2020

(54) APPARATUS AND METHODS FOR MERGING POST-WRITE READ AND SELECT GATE MAINTENANCE OPERATIONS

(71) Applicant: Western Digital Technologies, Inc., San Jose, CA (US)

(72) Inventors: Lior Avital, Kfar Saba (IL); Niles Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/223,510

(22) Filed: Dec. 18, 2018

(51) Int. Cl.
| | | |
|---|---|---|
| *G11C 11/41* | (2006.01) |
| *G11C 11/419* | (2006.01) |
| *G11C 11/56* | (2006.01) |
| *H03K 19/21* | (2006.01) |
| *G11C 29/52* | (2006.01) |
| *H03K 19/17796* | (2020.01) |
| *G11C 29/44* | (2006.01) |
| *H03K 19/1776* | (2020.01) |

(52) U.S. Cl.
CPC ........ *G11C 11/419* (2013.01); *G11C 11/5642* (2013.01); *G11C 29/44* (2013.01); *G11C 29/52* (2013.01); *H03K 19/1776* (2013.01); *H03K 19/17796* (2013.01); *H03K 19/21* (2013.01)

(58) Field of Classification Search
CPC ........ G11C 11/419; G11C 11/52; G11C 29/44
USPC ........................................ 365/185.03, 185.11
See application file for complete search history.

(56) References Cited

U.S. PATENT DOCUMENTS

| | | | | |
|---|---|---|---|---|
| 2013/0047044 A1* | 2/2013 | Weathers | ............... | G06F 11/076 714/708 |
| 2013/0322174 A1* | 12/2013 | Li | ........................ | G11C 29/025 365/185.09 |
| 2014/0025866 A1* | 1/2014 | Kim | .................... | G06F 12/0246 711/103 |
| 2014/0301142 A1* | 10/2014 | Stoev | ................. | G11C 16/3454 365/185.09 |

* cited by examiner

*Primary Examiner* — Han Yang
(74) *Attorney, Agent, or Firm* — Vierra Magen Marcus LLP (57) ABSTRACT

A method is provided that includes performing a post-write read operation on a block of memory cells that includes a select gate transistor, and based on results of the post-write read operation selectively performing a select gate maintenance operation on the select gate transistor.

20 Claims, 9 Drawing Sheets

APPARATUS AND METHODS FOR MERGING POST-WRITE READ AND SELECT GATE MAINTENANCE OPERATIONS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional stacked memory structure, or horizontally in a two-dimensional memory structure. One example of a three-dimensional memory structure is the Bit Cost Scalable (BiCS) architecture which includes a stack of alternating conductive and dielectric layers.

A memory device includes memory cells which may be arranged in memory strings, for instance, where select gate transistors are provided at the ends of each memory string to selectively connect a channel of the memory string to a source line or bit line. However, various challenges are presented in operating such memory devices.

DETAILED DESCRIPTION

In some memory devices, memory cells are coupled together such as in NAND strings. Each NAND string includes a drain-end and a source end, and includes multiple memory cells connected in series between one or more drain-end select gate transistors (referred to as SGD transistors) at the drain-end of the NAND string, and one or more source-end select gate transistors (referred to as SGS transistors) at the source-end of the NAND string. The one or more SGD transistors couple the NAND string to a corresponding bit line, and the one or more SGS transistors couple the NAND string to a corresponding source line.

In a three-dimensional memory structure, the memory cells may be arranged in vertical memory strings in a stack, where the stack includes alternating conductive and dielectric layers. The conductive layers act as word lines which are connected to control gates of the memory cells. Each memory string may have the shape of a pillar which intersects with the word lines to form the memory cells.

The memory cells can include data memory cells used to store user data, and dummy memory cells which are not used to store user data. A dummy word line is connected to a dummy memory cell. One or more dummy memory cells may be provided at the drain and/or source ends of a string of memory cells to provide a gradual transition in channel voltage gradient.

An array of memory cells may be divided into sets of memory cells referred to as blocks, where a block is the unit of erase. That is, each block contains the minimum number of memory cells that are erased together. Other embodiments can use different units of erase. Each block is typically divided into a number of pages, where a page is a unit of programming. That is, each page contains the minimum number of memory cells that are written together.

During a programming operation, memory cells are programmed according to a word line programming order. For example, the programming may start with the word line at the source side of a block and proceed to the word line at the drain side of the block. In an embodiment, each word line is completely programmed before programming a next word line. For example, a first word line (e.g., WL0) is programmed, then a second word line (e.g., WL1) is programmed, and so forth.

In an embodiment, a programming operation for a set of memory cells involves applying a series of program voltage (Vpgm) pulses to the memory cells after the memory cells are provided in an erased state (also referred to as a "program-erase cycle" or "P/E cycle"). Each Vpgm pulse is provided in a program loop, also referred to as a program-verify iteration. For example, the Vpgm pulses may be applied to a word line which is connected to control gates of the memory cells.

In an embodiment, incremental step pulse programming is performed, where the Vpgm pulse amplitude is increased by a step size in each program loop. Verify operations may be performed after each Vpgm pulse to determine whether the memory cells have completed programming. When programming is completed for a memory cell, the memory cell can be locked out from further programming while programming continues for other memory cells in subsequent program loops.

Each memory cell may be associated with a data state according to write data in a program command. Based on its data state, a memory cell will either remain in an erased state or be programmed to a programmed data state. For example, in a one bit per cell memory device, there are two data states including the erased state and the programmed state. In a two-bit per cell memory device, there are four data states including the erased state and three higher data states. In a three-bit per cell memory device, there are eight data states including the erased state and seven higher data states. In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage of the memory cell exceeds the read voltage.

The read voltages are set at levels which are expected to be between the threshold voltage levels of adjacent data states. During the read operation, the voltages of the unselected word lines are set to a read pass level which is high enough to place the unselected memory cells in a strongly conductive state, to avoid interfering with the sensing of the selected memory cells.

Some memory devices use various techniques to address read errors in memory systems. One technique, sometimes referred to as a "post-write read" (PWR) operation, performs a read operation after memory cells have been programmed with data to verify that the data read matches the data written. For example, after one or more pages of a block have been programmed with data, a PWR operation may be performed to verify that the data read matches the data written. A bit error rate (BER) is calculated based on the read results. A high BER may impair the performance of the memory device.

In an implementation of a PWR (sometimes referred to as an "enhanced" PWR (EPWR) operation), the calculated BER is compared to a threshold. If the calculated BER is less than the threshold, the block is considered "good," and programming may continue on additional word lines in the block. Alternatively, if the calculated BER is greater than or equal to the threshold, the block is considered "bad," and an error correction routine attempts to reconstruct the originally written data. If successful, the reconstructed data are written to another block, and the original block is retired. A retired block typically is not used for user data storage.

Another technique, sometimes referred to as a "select gate maintenance" (SGM) operation, determines the threshold voltages of one or more select gate transistors (e.g., SGD transistors or SGS transistors) coupled to memory cells, such as NAND or NOR strings of memory cells. To ensure proper program, erase and read operations in a memory string, the threshold voltage of SGD transistors (and SGS transistors) should be in a specified range. However, threshold voltages of SGD transistors (and SGS transistors) can decrease (also referred to herein as "downshift") or increase (also referred to herein as "upshift") over time. Read errors can result from select gate transistor downshift or upshift, and thus the impair the performance of the memory device. In particular, SGD transistor downshift and/or upshift can result in increased BER and failed bit count (FBC).

In an implementation of an SGM operation, the threshold voltage of a select gate transistor (e.g., an SGD transistor or an SGS transistor) is determined. In other implementations, SGM operations may be performed on dummy memory cells, and the threshold voltage of one or more dummy memory cells may be determined. For simplicity, the remaining description will refer to SGM operations performed on select gate transistors, but persons of ordinary skill in the art will understand that the same principles and techniques also may be applied to dummy memory cells.

If the threshold voltage of a select gate transistor is low (downshift), programming pulses may be applied to the select gate transistor to increase the threshold voltage of the select gate transistor so that the block that includes the select gate transistor may continue to be used. If the SGM operation determines that the threshold voltage of a select gate transistor is high (upshift), the block that includes the select gate transistor is retired.

PWR operations and SGM operations typically are independent operations that are used to address different causes of read errors. PWR operations typically are performed each time a block is written. If the PWR operation determines that the calculated BER is greater than or equal to the threshold, the block is typically retired, without performing any further analysis or operations to determine if the block may be reused.

SGM operations typically are performed at periodic intervals. For example, an SGM operation may be performed once every N P/E cycles (e.g., N=10,000). Because BER and/or FBC typically increase with increasing P/E cycles, the value of N may be specified based on the probability that after N P/E cycles, the BER and/or FBC may begin to fall outside a desired limit.

Although such probabilistic methods may be used to trigger SGM operations, such probabilistic methods have disadvantages. In particular, because SGM operations require time to execute, every SGM operation results in decreased system performance. If the value N is set too low, the performance of a memory device may be significantly degraded as a result of performing unnecessary SGM operations. Conversely, if the value N is set too high the performance of the memory device may be significantly degraded by unacceptably high BER and/or high FBC.

Technology is described for merging the PWR and SGM operations. In an embodiment, PWR operations are used to invoke SGM operations. In an embodiment, a PWR operation is performed on a block of memory cells, and a BER is calculated. In an embodiment, if the BER is greater than a first threshold value, SGM operations are performed to determine a threshold voltage of a select gate transistor (e.g., SGD or SGD transistor). If the determined threshold voltage is low (downshift), programming pulses may be applied to the select gate transistor to increase the threshold voltage of the select gate transistor so that the block that includes the select gate transistor may continue to be used. If the determined threshold voltage is high (upshift), the block that includes the select gate transistor is retired.

In another embodiment, if the BER is less than a first threshold value, the BER is compared to a second threshold lower than the first threshold. In an embodiment, if the BER is greater than a second threshold value, SGM operations are performed to determine a threshold voltage of a select gate transistor (e.g., SGD or SGD transistor). If the determined threshold voltage is low (downshift), programming pulses may be applied to the select gate transistor to increase the threshold voltage of the select gate transistor so that the block that includes the select gate transistor may continue to be used. If the determined threshold voltage is high (upshift), the block that includes the select gate transistor is retired.

In an embodiment, the second threshold is a fixed value. In another embodiment, the second threshold is an adaptive value. In an embodiment, the second threshold adapts based on a number of "false alarms." As used herein, a false alarm occurs if the BER is greater than the second threshold, but the select gate transistor (e.g., SGD or SGD transistor) does not experience a threshold voltage downshift or upshift.

Without wanting to be bound by any particular theory, it is believed that merging the PWR and SGM operations may improve memory system performance. Without wanting to be bound by any particular theory, it is believed that merging the two distinct operations may decrease the number of SGM operations performed without significantly degrading memory device performance. These and other features are discussed further below.

Figure 1:
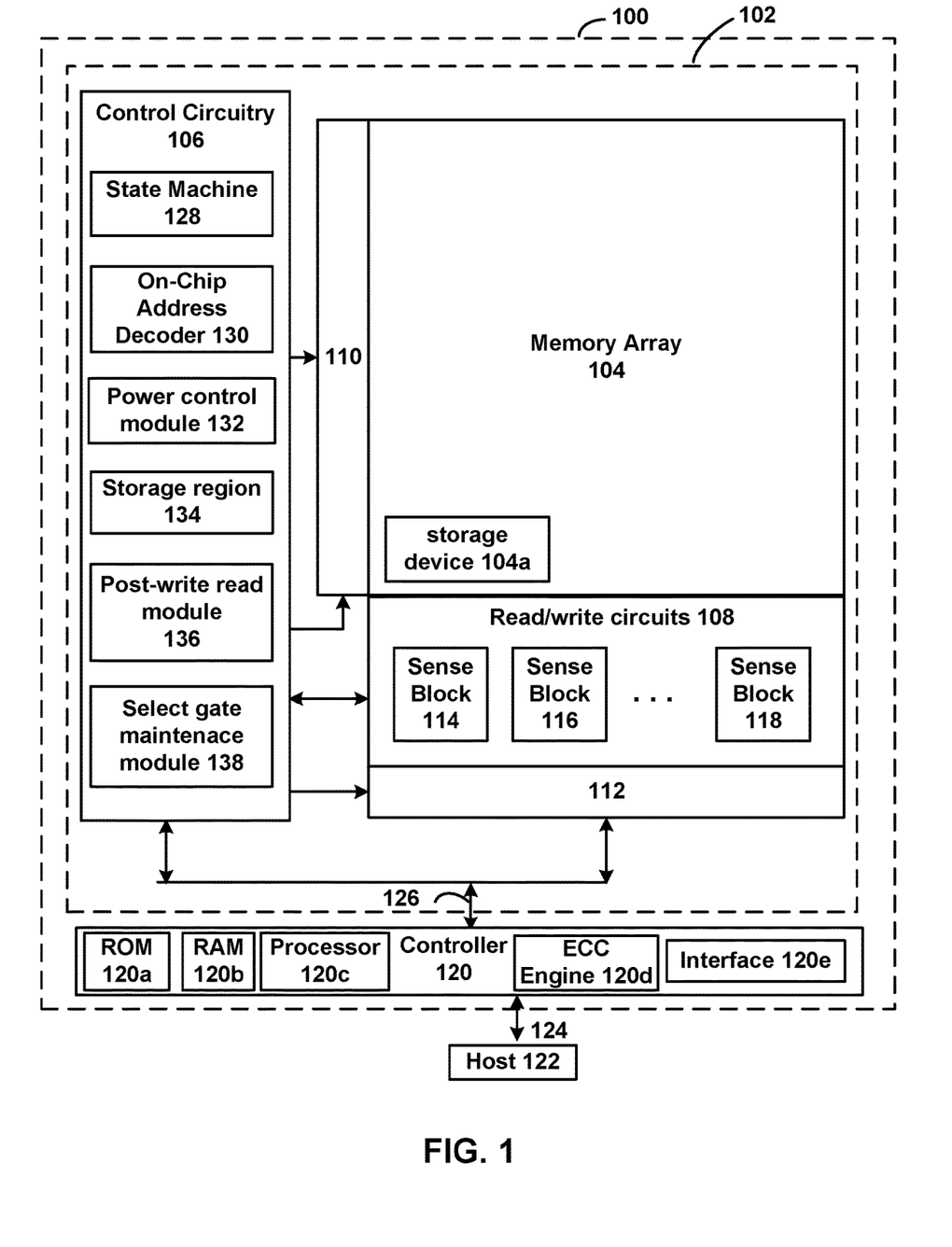
FIG. 1 is a block diagram of an example memory device.

FIG. 1 is a block diagram of an example memory device 100. Memory device 100, such as a non-volatile storage system, may include one or more memory die 102. Memory device 100 may be in any form, such as a flash drive, a solid state drive, a hard drive, a storage area network, or any other read/writeable computer-readable storage medium that includes solid state memory.

Memory die 102 includes a memory array 104, control circuitry 106, and read/write circuits 108. Memory array 104 may be a two-dimensional or three-dimensional array of memory cells, and is addressable by word lines via a row decoder 110 and by bit lines via a column decoder 112.

Read/write circuits 108 include multiple sense blocks 114, 116, . . . , 118 (sensing circuitry) that allow a page of memory cells to be read or programmed in parallel. Typically a controller 120 is included in the same memory device 100 (e.g., a removable storage card) as memory die 102, although controller 120 may be separate from memory die 102. Commands and data are transferred between a host 122 and controller 120 via a data bus 124, and between controller 120 and memory die 102 via lines 126.

Memory array 104 may include a monolithic three-dimensional memory array in which multiple memory levels are formed above (and not in) a single substrate, such as a wafer, with no intervening substrates. Memory array 104 may include any type of non-volatile memory that is monolithically formed in one or more physical levels of arrays of memory cells having an active area disposed above a silicon substrate. Memory array 104 may be in a non-volatile memory device having circuitry associated with the operation of the memory cells, whether the associated circuitry is above or within the substrate.

Control circuitry 106 cooperates with read/write circuits 108 to perform memory operations on memory array 104, and includes a state machine 128, an on-chip address decoder 130, a power control module 132, a storage region 134, a PWR module 136, and an SGM module 138. State machine 128 provides chip-level control of memory operations. Storage region 134 may be provided, e.g., for operational parameters and software/code. In one embodiment, state machine 128 is programmable by the software. In other embodiments, state machine 128 does not use software and is completely implemented in hardware (e.g., electrical circuits).

On-chip address decoder 130 provides an address interface between that used by the host to the hardware address used by row decoder 110 and column decoder 112. Power control module 132 controls the power and voltages supplied to the word lines, select gate lines, bit lines and source lines during memory operations. Power control module 132 can include drivers for word lines, SGS and SGD transistors and source lines. Sense blocks 114, 116, . . . , 118 can include bit line drivers.

PWR module 136 reads data that has been written to one or more pages of a block of memory cells to verify that the data read matches the data written. After comparing the data read to the data written, PWR module 136 determines a BER for the block. In an embodiment, PWR module 136 implements an EPWR operation that uses error correction to reconstruct originally written data even when errors exist in a subset of data that are read.

SGM module 138 determines the threshold voltage of select gate transistors (e.g., SGD transistors and/or SGS transistors) (or dummy memory cells). If SGM module 138 determines that the threshold voltage of a select gate transistor is low (e.g., below a first predetermined value), SGM module 138 attempts to program the select gate transistor to increase the threshold voltage of the select gate transistor, and continue using the block. If SGM module 138 determines that the threshold voltage of a select gate transistor is high (e.g., above a second predetermined value), SGM module 138 retires the block.

In some embodiments, some components can be combined. In some embodiments, one or more of the components (alone or combined) other than memory array 104 can be thought of as a control circuit which is configured to perform the techniques described herein including the steps of the processes described herein. For example, a control circuit may include any one of (or a combination of) control circuitry 106, state machine 128, row decoder 110, column decoder 112, power control module 132, sense blocks 114, 116, . . . , 118, read/write circuits 108, controller 120, PWR module 136, SGM module 138 and so forth.

Controller 120 (which in an embodiment is an electrical circuit) may include storage devices such as ROM 120a and RAM 120b, a processor 120c, and an error-correction code (ECC) engine 120d. ECC engine 120d can correct a number of read errors, and may be used by PWR module 136 to reconstruct data during an EPWR operation.

A memory interface 120e also may be provided. Memory interface 120e, in communication with ROM 120a, RAM 120b and processor 120c, is an electrical circuit that provides an electrical interface between controller 120 and memory die 102. In an embodiment, memory interface 120e can change the format or timing of signals, provide a buffer, isolate from surges, latch I/O and so forth. Processor 120c can issue commands to control circuitry 106 (or any other component of memory die 102) via memory interface 120e.

In an embodiment, memory device 100 includes code such as a set of instructions, and processor 120c is operable to execute the set of instructions to provide the functionality described herein. Alternatively or additionally, processor 120c can access code from a storage device 104a of memory array 104, such as a reserved area of memory cells in one or more word lines.

For example, code can be used by controller 120 to access memory array 104 for programming, read and erase operations. The code can include boot code and control code (e.g., a set of instructions). The boot code is software that initializes controller 120 during a booting or startup process and enables controller 120 to access memory array 104. The code can be used by controller 120 to control one or more memory arrays 104.

In an embodiment, upon power up, processor 120c fetches the boot code from ROM 120a or storage device 104a for execution, and the boot code initializes the system components and loads the control code into RAM 120b. Once the control code is loaded into RAM 120b, the control code is executed by processor 120c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below. A control circuit can be configured to execute the instructions to perform the functions described herein.

In an embodiment, host 122 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. Host 122 also may include additional system memory, one or more input/output interfaces and/or one or more input/output devices in communication with the one or more processors.

Memory array 104 may include resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor memory cells (also referred to herein as "memory elements") capable of storing information. Each type of memory device may have different configurations. For example, flash memory devices may be configured in a NAND or a NOR configuration.

Memory devices can be formed from passive and/or active elements, in any combinations. By way of non-limiting example, passive semiconductor memory cells include ReRAM memory cells, which in some embodiments include a resistivity switching storage element, such as an anti-fuse or phase change material, and optionally a steering element, such as a diode or transistor.

Further by way of non-limiting example, active semiconductor memory cells include EEPROM and flash memory cells, which in some embodiments include memory cells containing a charge storage region, such as a floating gate, conductive nanoparticles, or a charge storage dielectric material.

Memory array 104 may include memory cells configured so that they are connected in series or so that each memory cell is individually accessible. By way of non-limiting example, memory array 104 may include flash memory devices in a NAND configuration (NAND memory). A NAND string is an example of a set of series-connected transistors including memory cells and SGS and SGD transistors.

A NAND memory array may be configured to include multiple strings of memory in which a string is composed of multiple memory cells sharing a single bit line and accessed as a group. Alternatively, memory cells may be configured so that each cell is individually accessible, e.g., a NOR memory array. NAND and NOR memory configurations are examples, and memory cells in memory array 104 may be otherwise configured.

As described above, memory array 104 may be a two-dimensional or three-dimensional memory array. In a two-dimensional memory array, the semiconductor memory cells are arranged in a single plane or a single memory device level. Typically, in a two-dimensional memory structure, memory cells are arranged in a plane (e.g., in an x-y plane) which extends substantially parallel to a major surface of a substrate that supports the memory cells. The substrate may be a wafer over or in which the layer of the memory cells are formed or it may be a carrier substrate which is attached to the memory cells after they are formed.

As a non-limiting example, the substrate may include a semiconductor such as silicon. The memory cells may be arranged in the single memory device level in an ordered array, such as in a plurality of rows and/or columns. However, the memory cells may be arrayed in non-regular or non-orthogonal configurations. The memory cells may each have two or more electrodes or contact lines, such as bit lines and word lines.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate) with each column having multiple memory cells. The columns may be arranged in a two-dimensional configuration, e.g., in an x-y plane, resulting in a three-dimensional arrangement of memory cells with memory cells on multiple vertically stacked memory planes. Other configurations of memory cells in three dimensions can also constitute a three-dimensional memory array.

By way of non-limiting example, in a three-dimensional NAND memory array, the memory cells may be coupled together to form a NAND string within a single horizontal (e.g., x-y) memory device level. Alternatively, the memory cells may be coupled together to form a vertical NAND string that traverses multiple horizontal memory device levels.

Other three-dimensional configurations can be envisioned wherein some NAND strings contain memory cells in a single memory level while other strings contain memory cells which span through multiple memory levels. Three-dimensional memory arrays also may be designed in a NOR configuration and in a cross-point configuration.

Typically, in a monolithic three-dimensional memory array, one or more memory device levels are formed above a single substrate. Optionally, the monolithic three-dimensional memory array also may have one or more memory layers at least partially within the single substrate. As a non-limiting example, the substrate may include a semiconductor such as silicon.

In a monolithic three-dimensional memory array, the layers constituting each memory device level of the array are typically formed on the layers of the underlying memory device levels of the array. However, layers of adjacent memory device levels of a monolithic three-dimensional memory array may be shared or have intervening layers between memory device levels.

Two-dimensional memory arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory cells and for communication with the memory cells. As non-limiting examples, memory devices may have circuitry used for controlling and driving memory cells to accomplish functions such as programming, reading and erasing. This associated circuitry may be on the same substrate as the memory cells and/or on a separate substrate. For example, a controller for memory read-write operations may be located on a separate controller chip and/or on the same substrate as the memory cells.

One of skill in the art will recognize that this technology is not limited to the two-dimensional and three-dimensional exemplary structures described but covers all relevant memory structures within the spirit and scope of the technology as described herein and as understood by one of skill in the art.

Figure 2:
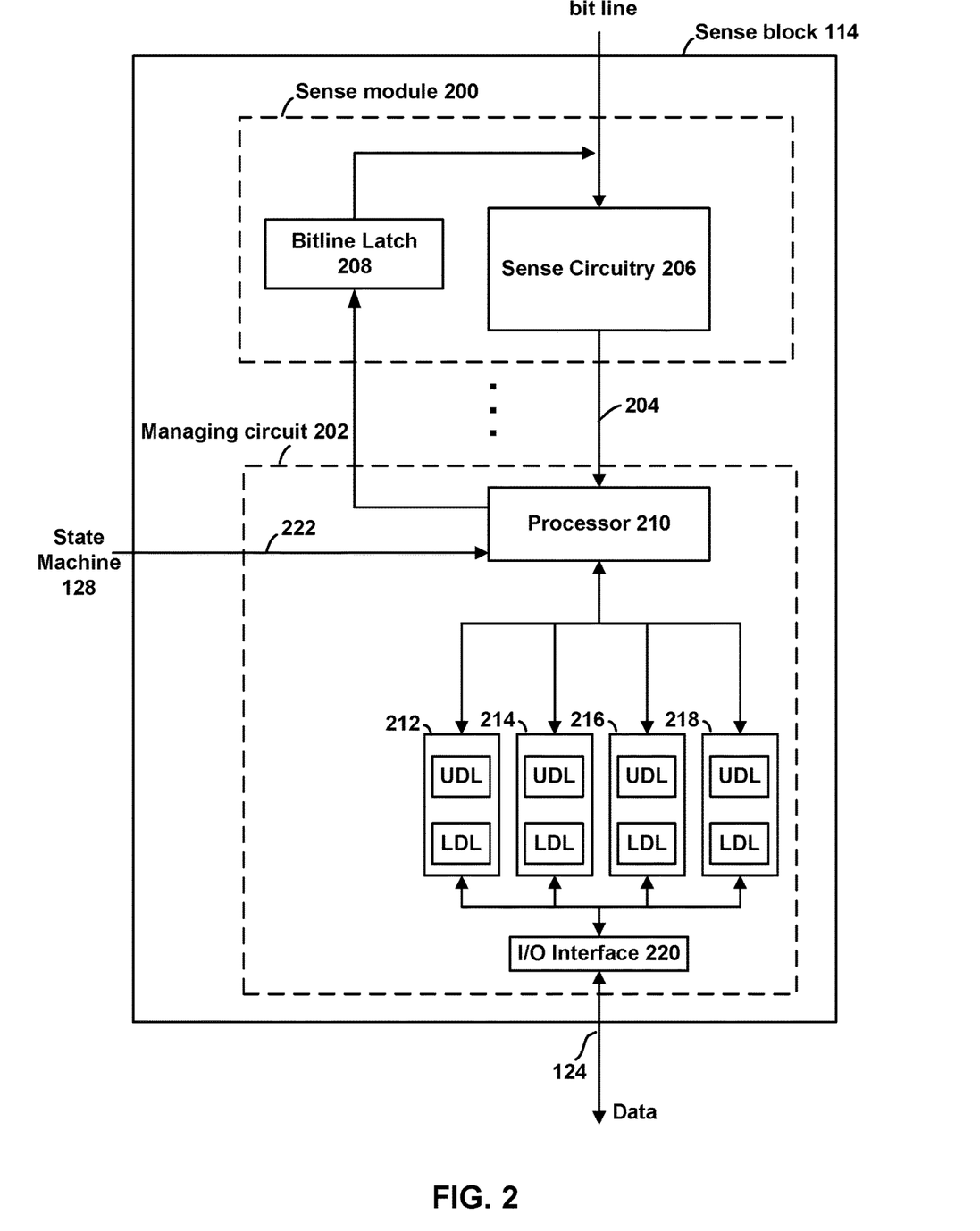
FIG. 2 is a block diagram depicting one embodiment of the sense block of FIG. 1.

FIG. 2 is a block diagram depicting one embodiment of sense block 114 of FIG. 1. An individual sense block 114 is partitioned into one or more core portions, referred to as sense modules 200 or sense amplifiers, and a common portion, referred to as a managing circuit 202. In one embodiment, there will be a separate sense module 200 for each bit line and one common managing circuit 202 for a set of multiple, e.g., four or eight, sense modules 200. Each of the sense modules 200 in a group communicates with the associated managing circuit via data bus 204. Thus, there are one or more managing circuits 202 which communicate with the sense modules 200 of a set of memory cells.

Sense module 200 includes sense circuitry 206 that performs sensing by determining whether a conduction current in a connected bit line is above or below a predetermined threshold level. Sense module 200 also includes a bit line latch 208 that is used to set a voltage condition on the connected bit line. For example, a predetermined state latched in bit line latch 208 will result in the connected bit line being pulled to a state designating program inhibit (e.g., 1.5-3 V). As an example, a flag=0 can inhibit programming, while flag=1 does not inhibit programming.

Managing circuit 202 includes a processor 210, four example sets of data latches 212-218 and an I/O Interface 220 coupled between the set of data latches 212 and data bus 124. One set of data latches can be provide for each sense module 220, and data latches identified by LDL and UDL may be provided for each set. In some cases, additional data latches may be used. LDL stores a bit for a lower page of data, and UDL stores a bit for an upper page of data. This is in a four-level or two-bits per memory cell. One additional data latch per bit line can be provided for each additional data bit per memory cell.

Processor 210 performs computations, such as to determine the data stored in the sensed memory cell and store the determined data in the set of data latches. Each set of data latches 212-218 is used to store data bits determined by processor 210 during a read operation, and to store data bits imported from the data bus 124 during a programming operation which represent write data meant to be programmed into the memory. I/O interface 220 provides an interface between data latches 212-218 and the data bus 124.

During reading, the operation of the system is under the control of state machine 128 that controls the supply of different control gate voltages to the addressed memory cell. While stepping through the various predefined control gate voltages corresponding to the various memory states supported by the memory, sense module 200 may trip at one of these voltages and a corresponding output will be provided from sense module 200 to processor 210 via bus 204.

At that point, processor 210 determines the resultant memory state by considering the tripping event(s) of the sense module and the information about the applied control gate voltage from state machine 128 via input lines 222. Processor 210 then computes a binary encoding for the memory state and stores the resultant data bits into data latches 212-218. In another embodiment of managing circuit 202, bit line latch 208 serves double duty, both as a latch for latching the output of sense module 200 and also as a bit line latch as described above.

During program or verify operations, the data to be programmed (write data) is stored in the set of data latches 212-218 from data bus 124, in the LDL and UDL latches, in a two-bit per memory cell implementation. In a three-bit per memory cell implementation, an additional data latch may be used. The programming operation, under the control of state machine 128, includes a series of programming voltage pulses applied to the control gates of the addressed memory cells. Each program pulse is followed by a read back (verify) to determine if the memory cell has been programmed to the desired memory state.

In some cases, processor 210 monitors the read back memory state relative to the desired memory state. When the two are in agreement, processor 210 sets the bit line latch 208 to cause the bit line to be pulled to a state designating program inhibit. This inhibits the memory cell coupled to the bit line from further programming even if program pulses appear on its control gate.

Figure 3:
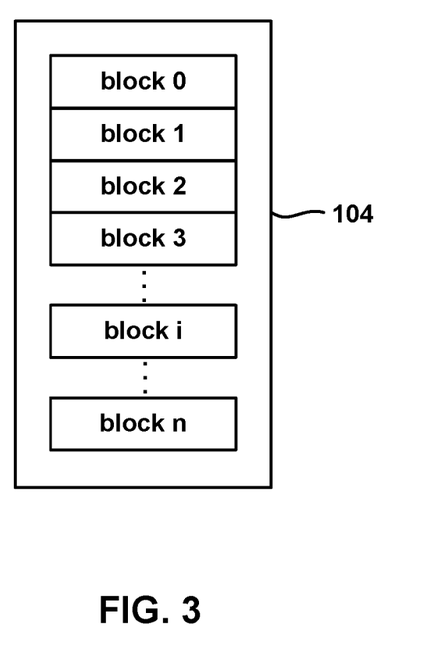
FIG. 3 depicts an example structure of the memory array of FIG. 1

FIG. 3 depicts an example structure of memory array 104 of FIG. 1. In an embodiment, the array of memory cells is divided into sets of memory cells referred to as blocks, where a block is the unit of erase. That is, each block contains the minimum number of memory cells that are erased together. Other embodiments can use different units of erase.

Each block is typically divided into a number of pages. In one embodiment, a page is a unit of programming. One or more pages of data are typically stored in one row of memory cells. A page can store one or more sectors. A sector includes user data and overhead data. Overhead data typically includes an ECC that has been calculated from the user data of the sector. The memory cells of each word line of a block can typically store one page or an integer number of multiple pages.

Figure 4:
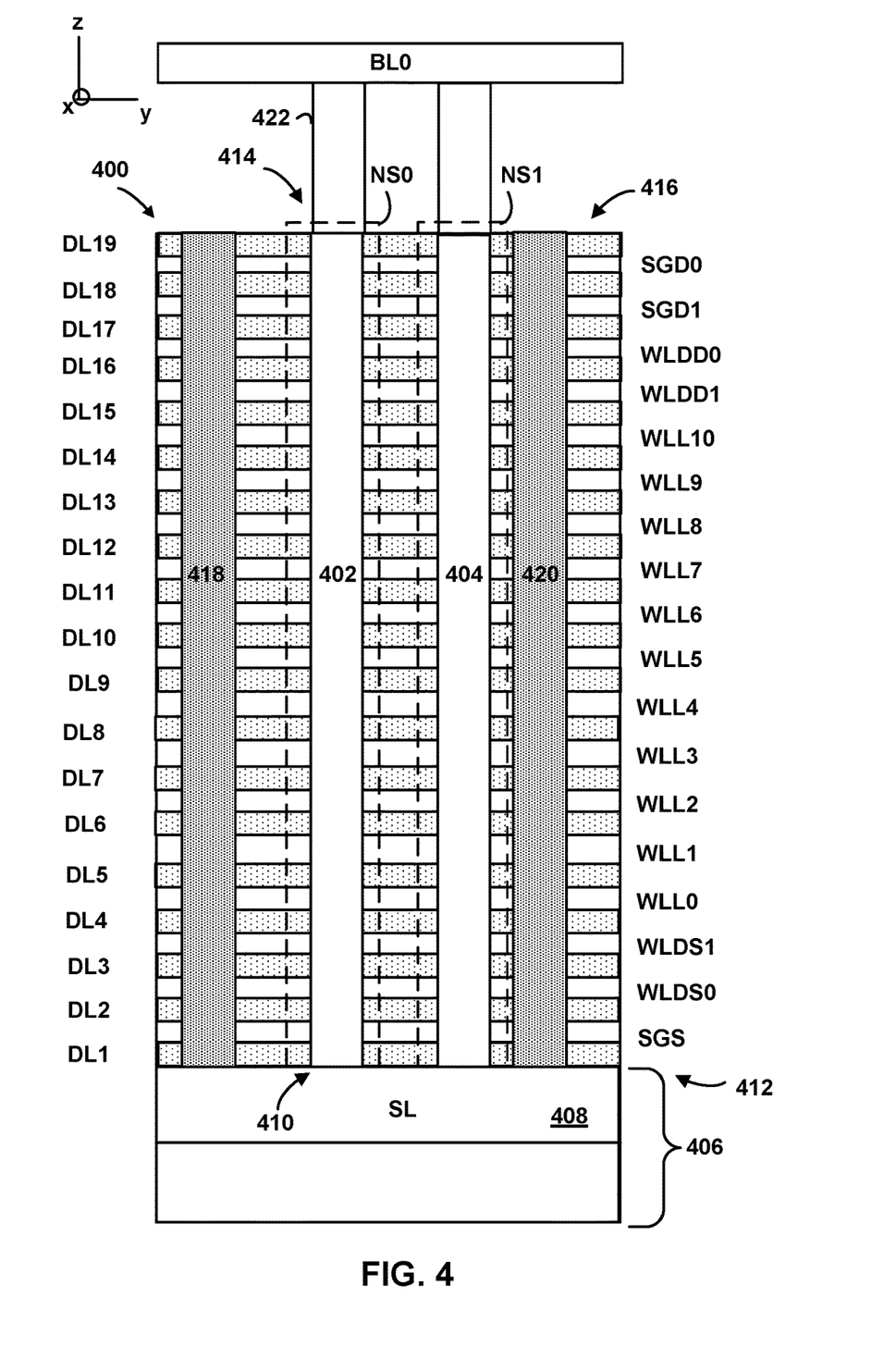
FIG. 4 depicts an example cross-sectional view of a portion of one of the blocks of FIG. 3.

FIG. 4 depicts an embodiment of a portion of one of the blocks of FIG. 3. The portion of the block includes a stack 400 of alternating conductive and dielectric layers. In this example, the conductive layers include two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10.

WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-DL19. Further, regions of stack 400 which include NAND strings NS0 and NS1 are depicted. Each NAND string encompasses a memory hole 402 or 404 which is filled with materials which form memory cells adjacent to the word lines.

Stack 400 includes a substrate 406. In one approach, a portion of the source line SL includes an n-type source diffusion layer 408 which is in contact with a source end of each string of memory cells in a block.

NAND string NS0 has a source-end 410 at a bottom 412 of stack 400 and a drain-end 414 at a top 416 of stack 400. Metal-filled slits 418 and 420 may be provided periodically across stack 400 as interconnects which extend through stack 400 to connect source line SL to a line above stack 400. Metal-filled slits 418 and 420 may be used during the formation of the word lines and subsequently filled with metal. A portion of a bit line BL0 is also depicted. A conductive via 422 connects drain-end 416 to BL0.

In an embodiment, each select gate transistor (SGD/SGS) or memory cell has a threshold voltage (Vth) and a control gate or word line voltage. Typical values can include Vth=2 V for the SGD transistors and Vth=1 V for the dummy memory cells. The threshold voltage of a data memory cell can vary based on whether the cell is programmed, and if it is programmed, based on its data state. Generally, the programming of the memory cells is random so that a memory string will have cells in different states.

Figure 5:
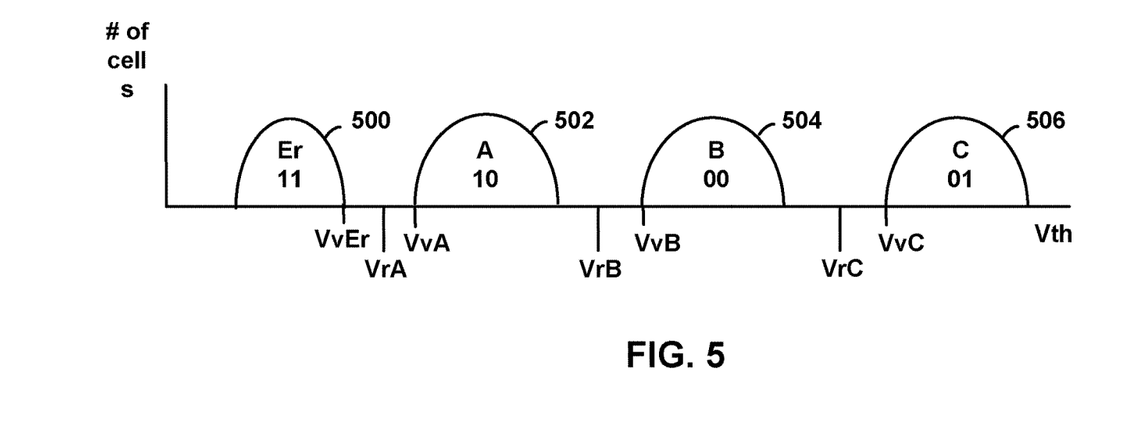
FIG. 5 depicts an example threshold voltage distribution of a set of memory cells connected to a selected word line after a programming operation, where four data states are used.

FIG. 5 depicts an example Vth distribution of a set of memory cells connected to a selected word line after a programming operation, where four data states are used. A threshold voltage distribution 500 is provided for erased (Er) state memory cells. Three threshold voltage distributions 502, 504 and 506 represent assigned data states A, B and C, respectively, which are reached by memory cells when their threshold voltage exceeds the verify voltage VvA, VvB or VvC, respectively. This example uses four data states. Other numbers of data states can be used as well, such as eight or sixteen. Read voltages VrA, VrB and VrC are used to read data from a set of memory cells having this threshold voltage distribution. These verify voltages and read voltages are examples of control gate read levels of the selected word line voltage. VvEr is an erase-verify voltage for use in an erase operation.

During a programming operation, the final threshold voltage distribution can be achieved by using one or more programming passes. Each pass may use incremental step pulse programming, for instance. During a programming pass, program loops are performed for a selected word line. A program loop includes a program portion in which a program voltage is applied to the word line followed by a verify portion in which one or more verify tests are performed. Each programmed state has a verify voltage which is used in the verify test for the state.

A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass.

After the programming pass is completed, the data can be read from the memory cells using read voltages which are between the threshold voltage distributions. To read data from a memory cell, read voltages are applied to the word line associated with the memory cell. At the same time, a read pass voltage (e.g., 9 V) is applied to the remaining word lines. By testing whether the threshold voltage of a given memory cell is above or below one or more of the read reference voltages, the system can determine the data state which is represented by a memory cell. These voltages are demarcation voltages because they demarcate between threshold voltage ranges of different data states.

Figure 6:
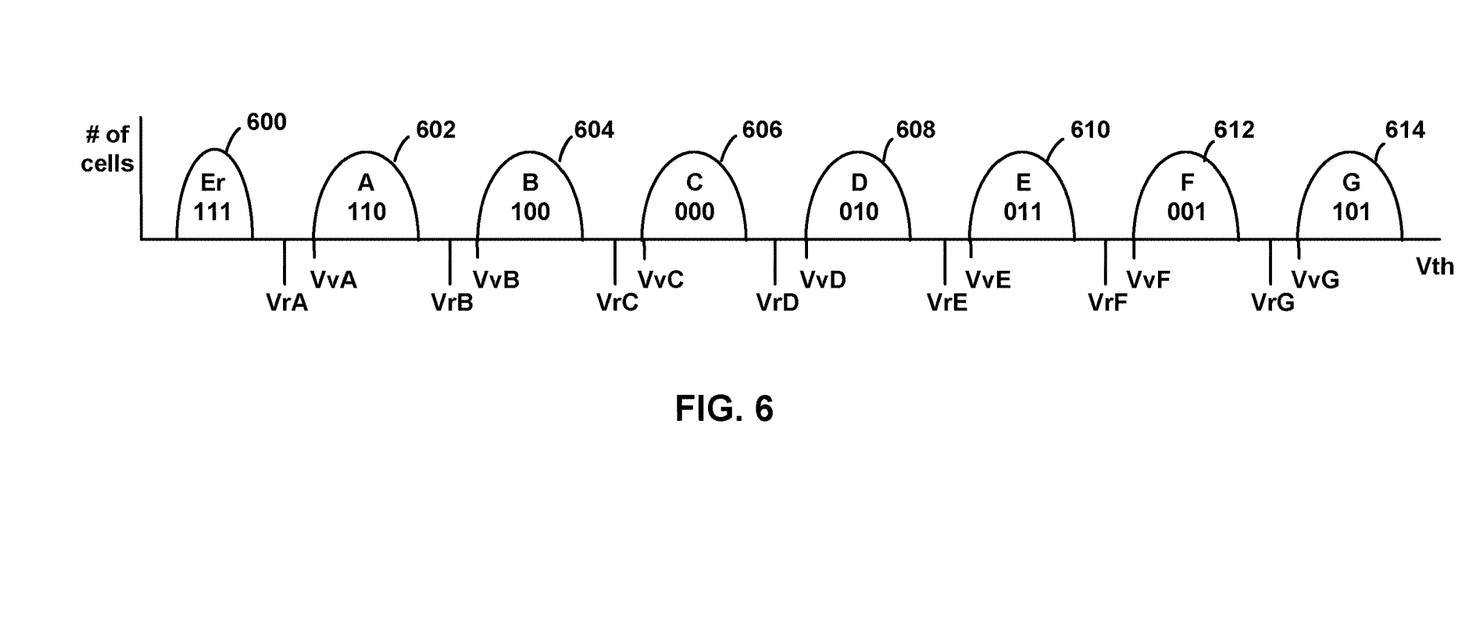
FIG. 6 depicts an example threshold voltage distribution of a set of memory cells connected to a selected word line after a programming operation, where eight data states are used.

FIG. 6 depicts an example threshold voltage distribution of a set of memory cells connected to a selected word line after a programming operation, where eight data states are used. Single-pass or multi-pass programming may be used to obtain this threshold voltage distribution. Based on the write data as indicated, the memory cells which are to remain in the Er state are represented by the Vth distribution 600.

The cells which are to be programmed to the A, B, C, D, E, F and G states using verify voltages of VvA, VvB, VvC, VvD, VvE, VvF and VvG, respectively, are represented by the threshold voltage distributions 600, 602, 604, 606,608, 610, 612 and 614, respectively. Each data state represents three bits of data as indicated. Read voltages VrA, VrB, VrC, VrD, VrE, VrF and VrG can be used for reading the states of the cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively.

As described above, some memory devices use various PWR and/or SGM operations to address read errors in memory systems. For example, after one or more pages of a block of memory cells are programmed with data, PWR module 136 (FIG. 1) reads the programmed memory cells to verify that the data read matches the data written. In an embodiment, PWR module 136 calculates a BER based on the read results, and compares the calculated BER to a threshold.

In an embodiment, if the calculated BER is less than the threshold, PWR module 136 considers the block "good," and programming may continue the block. In an embodiment, if the calculated BER is greater than or equal to the threshold, PWR module 136 performs an error correction routine to attempt reconstructing the originally written data. If successful, the reconstructed data are written to another block, and the original block is retired.

In addition, SGM module 138 (FIG. 1) determines the threshold voltages of one or more select gate transistors (e.g., SGD transistors or SGS transistors) (or dummy memory cells). If SGM module 138 determines that the threshold voltage of a select gate transistor is low, programming pulses may be applied to the select gate transistor to increase the threshold voltage of the select gate transistor so that the block that includes the select gate transistor may continue to be used. If SGM module 138 determines that the threshold voltage of a select gate transistor is high, the block that includes the select gate transistor is retired.

As described above, in an embodiment, SGM module 138 determines threshold voltages of particular select gate transistors once every N (e.g., N=1000) program/erase cycles.

In another embodiment, the operations of PWR module 136 and SGM module 138 are merged. In particular, a post-write read operation is performed on a block of memory cells that includes a select gate transistor. Based on results of the post-write read operation, a select gate maintenance operation is selectively performed on the select gate transistor.

Figure 7:
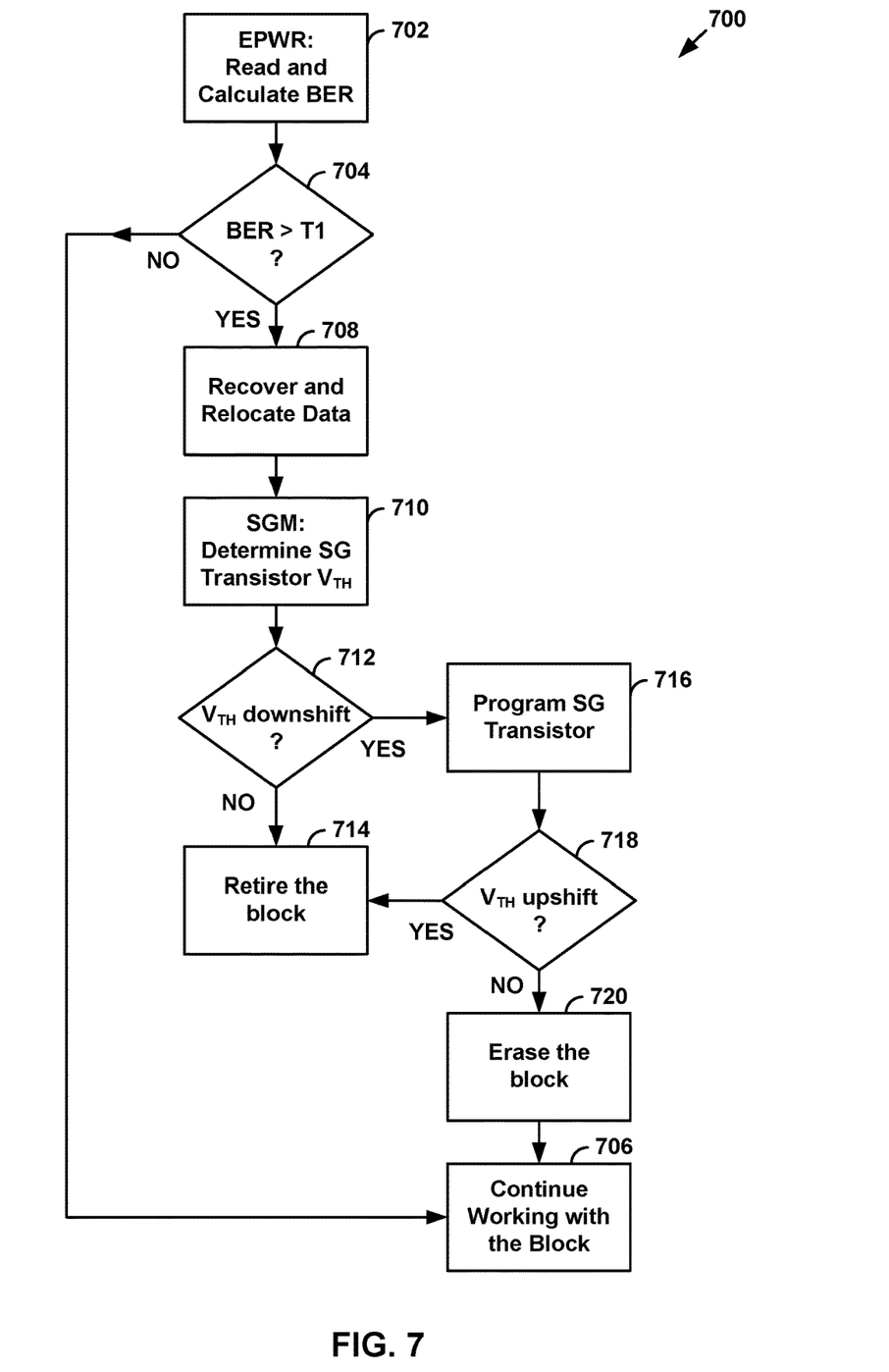
FIG. 7 is a flowchart describing an embodiment of a process for performing post-write read and select gate maintenance operations.

For example, FIG. 7 is a flowchart describing an embodiment of a process 700 for merging post-write read and a select gate maintenance operations. In an example embodiment, process 700 is performed on memory die 102 using the one or more control circuits discussed above (see FIG. 1), including PWR module 136 and SGM module 138. In other embodiments, other circuits may be used to implement process 700.

At step 702, PWR module 136 reads data from a block of memory cells after data are written to one or more pages of the block to verify that the data read matches the data written. After comparing the data read to the data written, PWR module 136 determines a BER for the block.

In an embodiment, a block may include multiple word lines (e.g., 96 word lines), and each word line may include multiple pages (e.g., 4 pages), with word lines written in sequential order. For example, a first word line WL0 includes pages P0, P1, P2, P3, a second word line WL1 includes pages P4, P5, P6, P7, and third word line WL2 includes pages P8, P9, P10, P11, and soon. In an embodiment, word lines are written in sequential order starting with word line WL0, then wordlineWL1, and so on.

In an embodiment, after programming completes for the first two word lines (WL0 and WL1), PWR module 136 reads data from first page P0 of first word line WL0, compares the data read to the data written, and determines a BER for the entire block based on data read from first page P0. In other embodiments, PWR module 136 may read data from other and/or other word lines to calculate a BER for the entire block.

At step 704, PWR module 136 compares the calculated BER to a first threshold T1. In an embodiment, first threshold T1 is specified at a value just below the maximum error rate that may be corrected by ECC engine 120*d* (FIG. 1). In embodiments, first threshold T1 may be between about 1.0% and about 1.6%, although other values may be used.

If at step 704 a determination is made that the calculated BER is not greater than first threshold T1, the process proceeds to step 706 and memory device 100 continues working with the block. In the example described above, if PWR module 136 determines BER after the first two word lines are programmed, and at step 704 a determination is made that the calculated BER is not greater than first threshold T1, then at step 706 memory device 100 continues programming the remaining word lines of the block.

If at step 704 a determination is made that the calculated BER is greater than first threshold T1, process 700 invokes SGM operations, and the process proceeds to step 708 to attempt to recover the data written to the block (e.g., using ECC engine 120*d*), and relocate the data to another block.

At step 710, SGM module 138 determines the threshold voltage of select gate transistors (e.g., SGD transistors and/or SGS transistors). In an embodiment, SGM module 138 determines the threshold voltage of one or more select gate transistors (e.g., SGD transistors and/or SGS transistors) in NAND strings in the block being programmed.

At step 712 a determination is made whether the determined threshold voltage of a select gate transistor is low (downshift) (e.g., below a first predetermined value). If the threshold voltage of the select gate transistor is not low, it is assumed that the threshold voltage of the select gate transistor is high (upshift), and at step 714 the block being programmed is retired.

If however at step 712 a determination is made that the determined threshold voltage of the select gate transistor is low (downshift), at step 716 SGM module 138 attempts to program the select gate transistor to increase the threshold voltage of the select gate transistor. For example, one or more program pulses are applied to the control gate of the select gate transistor.

Programming the select gate transistor may increase the threshold voltage too high. Thus, at step 718 a determination is made whether the threshold voltage of the select gate transistor is high (e.g., above a second predetermined value). If the threshold voltage of the select gate transistor is high, at step 714 the block being programmed is retired.

If however at step 718 a determination is made that the threshold voltage of the select gate transistor is not high (e.g., at or below the second predetermined value), at step 720 the block is erased, and at step 706 memory device 100 continues working with the block (e.g., the block may be used for programming other data).

Thus, process 700 merges PWR and SGM operations. In particular, SGM module 138 performs select gate maintenance operations on a block only if PWR module 136 first determines that the BER is greater than first threshold T1. Without wanting to be bound by any particular theory, it is believed that there is a correlation between select gate transistor threshold voltage downshifts/upshifts, and thus if the BER is not too high, SGM operations need not be performed. Without wanting to be bound by any particular theory, it is believed that merging PWR and SGM operations may decrease the number of SGM operations performed without degrading memory device performance.

As described above, in process 700 SGM module 138 performs SGM operations on a block only if PWR module 136 first determines that the BER is greater than first threshold T1. In some instances, however, if first threshold T1 is set too high process 700 may invoke the SGM operations too late. That is, by invoking SGM operations only after PWR module 136 first determines that the BER is greater than first threshold T1, the downshift in select gate transistor threshold voltages may be too large for SGM module 138 to correct.

Figure 8:
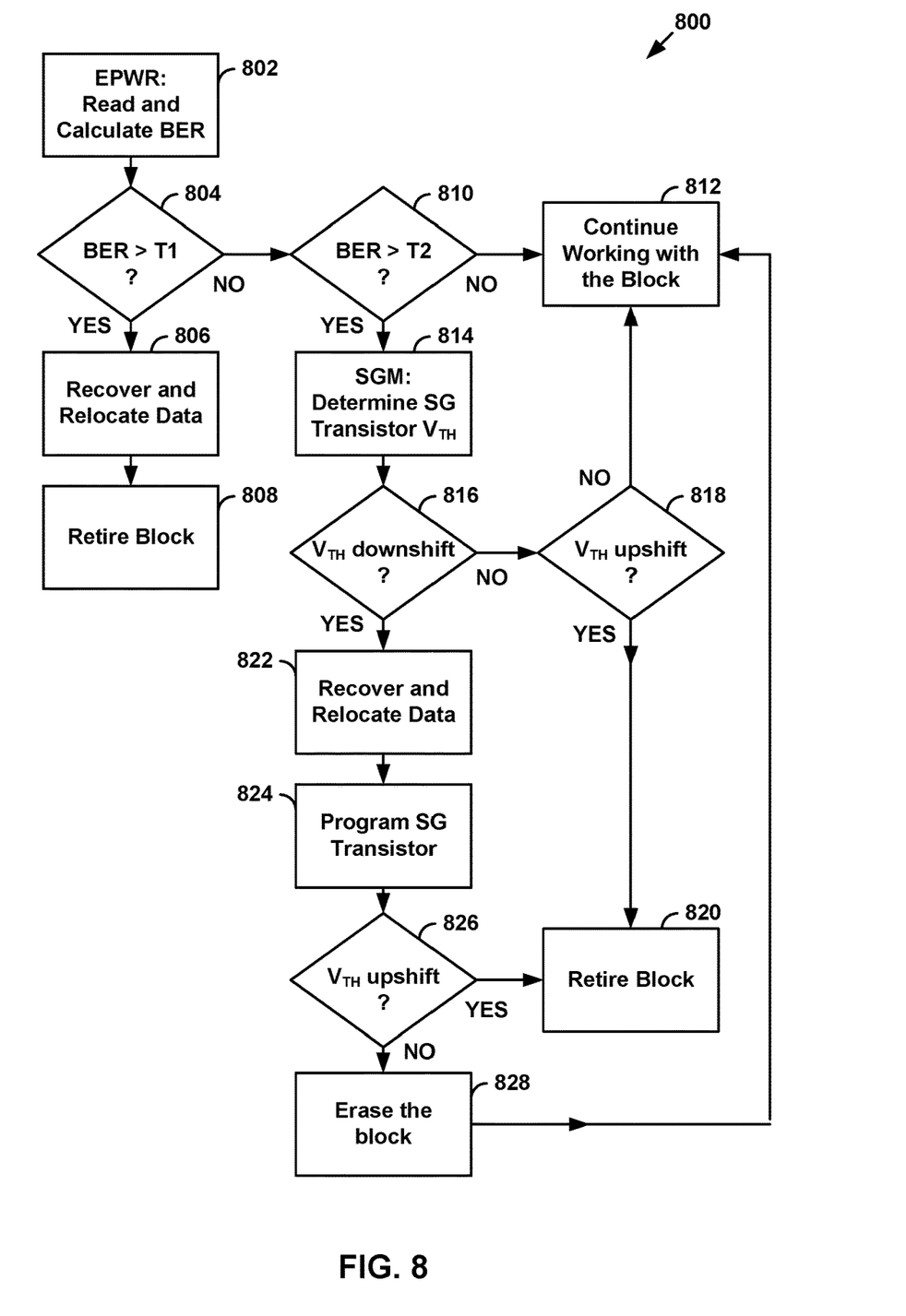
FIG. 8 is a flowchart describing an embodiment of a process for performing post-write read and select gate maintenance operations.

FIG. 8 is a flowchart describing an embodiment of a process 800 for merging post-write read and a select gate maintenance operations that uses first threshold T1 for determining when the BER is so high that the block must be retired, and a second threshold T2 lower than first threshold T1 for determining when to invoke SGM operations. In an example embodiment, process 800 is performed on memory die 102 using the one or more control circuits discussed above (see FIG. 1), including PWR module 136 and SGM module 138. In other embodiments, other circuits may be used to implement process 800.

At step 802, PWR module 136 reads data from a block of memory cells after data are written to one or more pages of the block to verify that the data read matches the data written. After comparing the data read to the data written, PWR module 136 determines a BER for the block, such as the techniques described above for step 702 of process 700.

At step 804, PWR module 136 compares the calculated BER to first threshold T1. In an embodiment, first threshold T1 is specified at a value just below the maximum error rate that may be corrected by ECC engine 120*d* (FIG. 1). In embodiments, first threshold T1 may be between about 1.0% and about 1.6%, although other values may be used.

If at step 804 a determination is made that the calculated BER is greater than first threshold T1, the process proceeds to step 806 to attempt to recover the data written to the block (e.g., using ECC engine 120*d*), and relocate the data to another block. At step 806 the block being programmed is retired.

If at step 804 a determination is made that the calculated BER is not greater than first threshold T1, the process proceeds to step 810, and PWR module 136 compares the calculated BER to second threshold T2. In an embodiment, second threshold T2 is specified at a value less than first threshold T2. In an embodiment, second threshold T2 is determined empirically (e.g., from data obtained during manufacture, testing, or once in use). In embodiments, second threshold T2 may be between about 0.7% and about 0.9%, although other values may be used.

If at step 810 a determination is made that the calculated BER is not greater than second threshold T2, the process proceeds to step 812 and memory device 100 continues working with the block. In other words, if the calculated BER is not greater than first threshold or second threshold T2, memory device 100 continues working with the block. In the example described above, if PWR module 136 determines BER after the first two word lines are programmed, and at step 810 a determination is made that the calculated BER is less than second threshold T2, then at step 812 memory device 100 continues programming the remaining word lines of the block.

Although not shown in process 800, in another embodiment, at step 804 if a determination is made that the calculated BER is not greater than first threshold T1, step 810 may be implemented if a predetermined number of P/E cycles have been completed for the block. Otherwise, the process proceeds to step 812 and memory device 100 continues working with the block. In such an embodiment, the second threshold T2 test is not implemented until at least the predetermined number of P/E cycles have been completed for the block.

Referring again to FIG. 8, if at step 810 a determination is made that the calculated BER is greater than second threshold T2, process 800 invokes SGM operations. In particular, at step 814 SGM module 138 determines the threshold voltage of select gate transistors (e.g., SGD transistors and/or SGS transistors). In an embodiment, SGM module 138 determines the threshold voltage of one or more select gate transistors (e.g., SGD transistors and/or SGS transistors) in NAND strings in the block being programmed.

At step 816 a determination is made whether the determined threshold voltage of a select gate transistor is low (downshift) (e.g., below a first predetermined value). If the threshold voltage of the select gate transistor is not low, at step 818 a determination is made whether the determined threshold voltage of the select gate transistor is high (upshift) (e.g., above a second predetermined value).

If the determined threshold voltage of the select gate transistor is not high, at step 812 memory device 100 continues working with the block. In this instance, this scenario is a false alarm. That is, the determined BER is greater than second threshold T2, but the select gate transistor did not experience a threshold voltage downshift or upshift. In the example described above, if PWR module 136 determines BER after the first two word lines are programmed, and at step 810 a determination is made that the calculated BER is less than second threshold T2, then at step 812 memory device 100 continues programming the remaining word lines of the block.

If however at step 818 a determination is made that the determined threshold voltage of the select gate transistor is high, at step 820 the block being programmed is retired.

If at step 816 a determination is made that the determined threshold voltage of the select gate transistor is low (downshift), the process proceeds to step 822 to attempt to recover the data written to the block (e.g., using ECC engine 120d), and relocate the data to another block.

At step 824 SGM module 138 attempts to program the select gate transistor to increase the threshold voltage of the select gate transistor. For example, one or more program pulses are applied to the control gate of the select gate transistor.

Programming the select gate transistor may increase the threshold voltage too high. Thus, at step 826 a determination is made whether the threshold voltage of the select gate transistor is high (e.g., above the second predetermined value). If the threshold voltage of the select gate transistor is high, at step 820 the block being programmed is retired.

If however at step 826 a determination is made that the threshold voltage of the select gate transistor is not high (e.g., at or below the second predetermined value), at step 828 the block is erased, and at step 812 memory device 100 continues working with the block (e.g., the block may be used for programming other data).

As described above, in process 800 if the determined BER is greater than second threshold T2, but SGM module 138 does not detect a threshold voltage downshift or upshift, the result is a false alarm. If a large number of false alarms occur, second threshold T2 (which is a fixed value) may be set too high, and SGM operations may be unnecessarily invoked.

Figure 9:
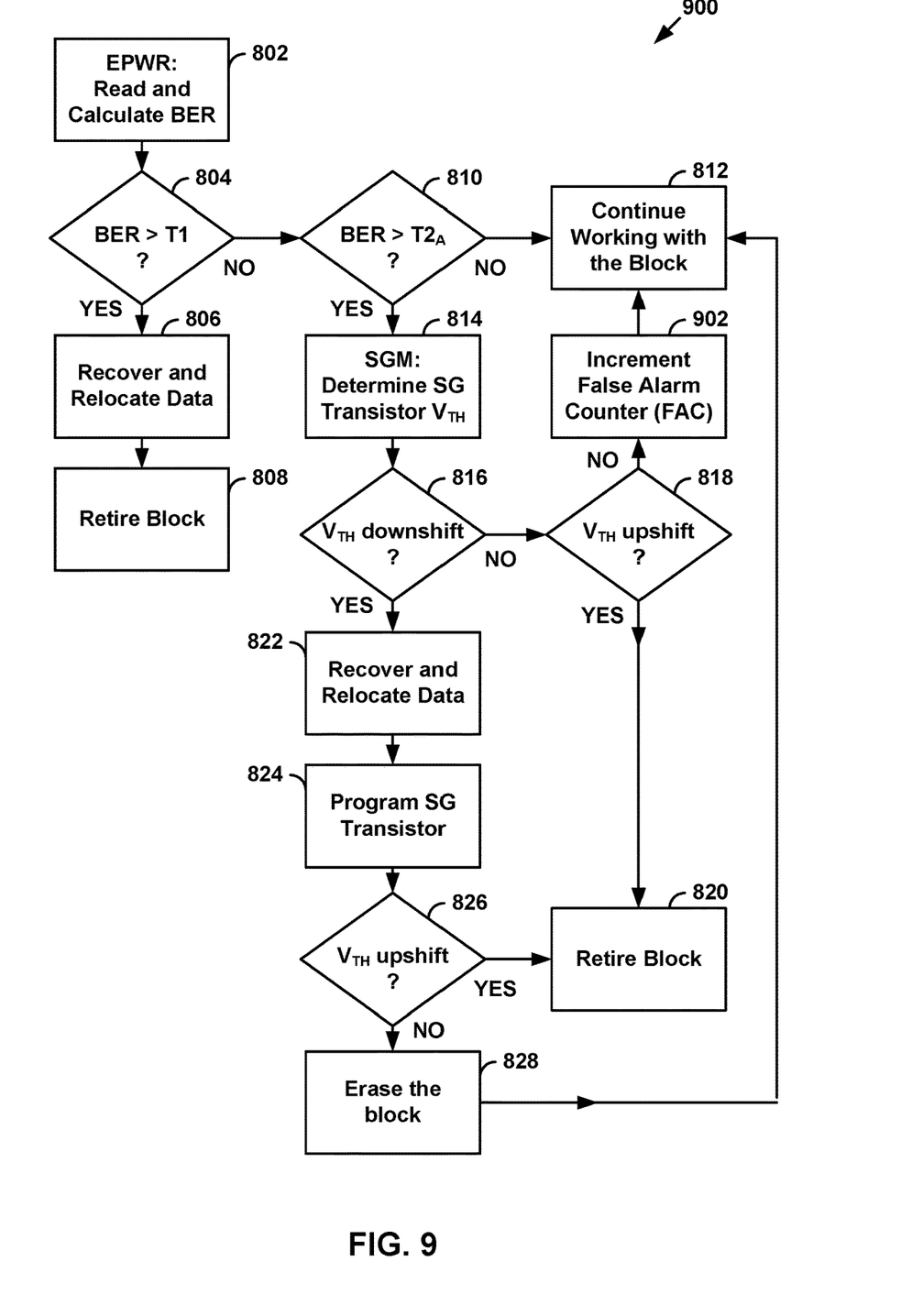
FIG. 9 is a flowchart describing an embodiment of a process for performing post-write read and select gate maintenance operations.

FIG. 9 is a flowchart describing an embodiment of a process 900 for merging post-write read and a select gate maintenance operations that uses an adaptive second threshold $T2_A$ lower than first threshold T1 for determining when to invoke SGM operations. In particular, process 900 maintains a count of a number of false alarms, and adjusts adaptive second threshold $T2_A$ higher (if the number of false alarms is too high) or lower (if the number of false alarms is too low). In an example embodiment, process 900 is performed on memory die 102 using the one or more control circuits discussed above (see FIG. 1), including PWR module 136 and SGM module 138. In other embodiments, other circuits may be used to implement process 900.

In an embodiment, process 900 includes the same steps as process 800 (described above), but also includes an additional step 902. In particular, if at step 816 a determination is made that the threshold voltage of the select gate transistor is not low, at if at step 818 a determination is made that the threshold voltage of the select gate transistor is not high, at step 902 a false alarm counter (FAC) is incremented, and then at step 812 memory device 100 continues working with the block. In this regard, process 900 keeps track of the number of false alarms for the block. In an embodiment, the number of false alarms may be used to adjust adaptive second threshold $T2_A$ higher (if the number of false alarms is too high) or lower (if the number of false alarms is too low).

Figure 10:
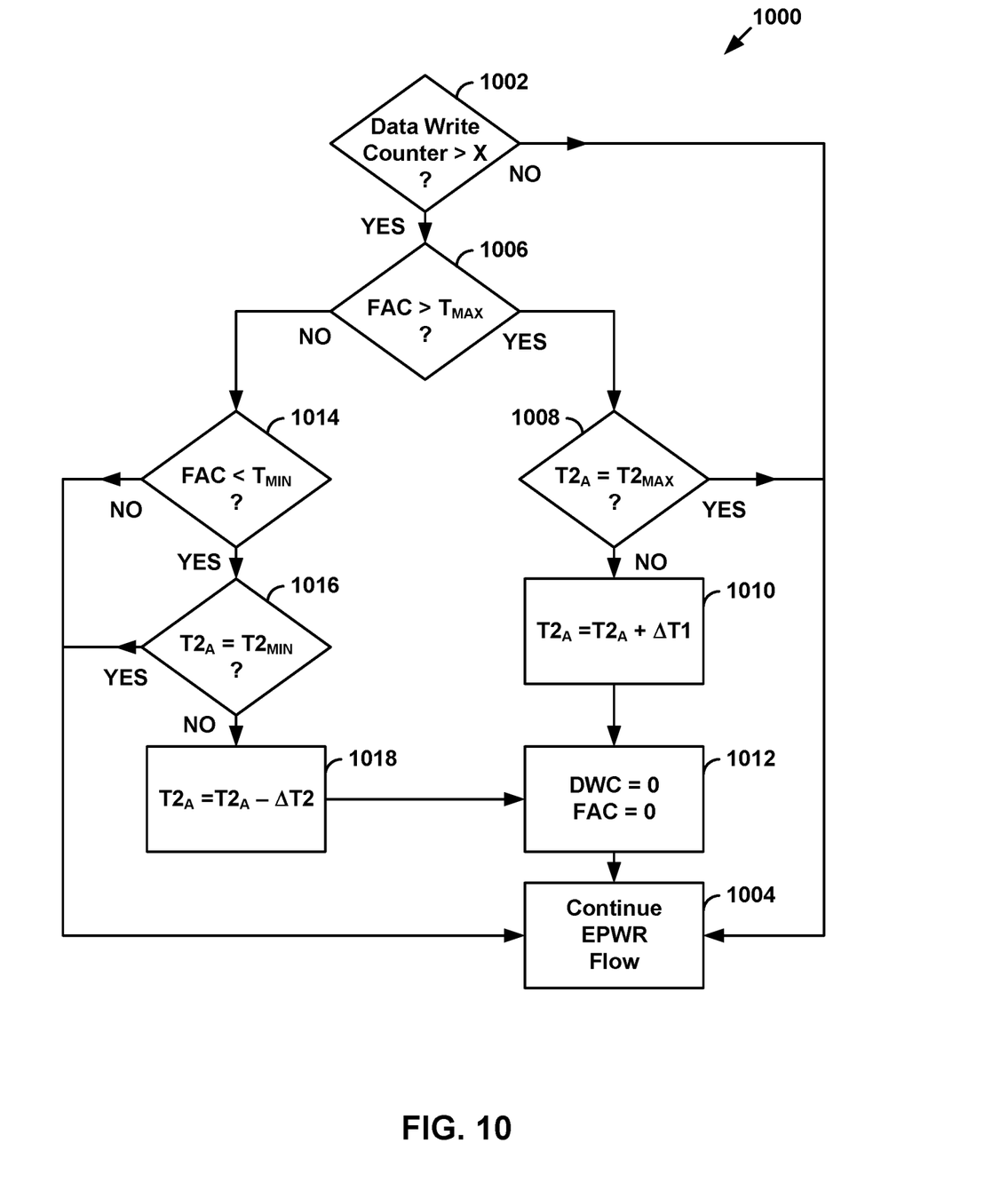
FIG. 10 is a flowchart describing an embodiment of a process for determining an adaptive bit error rate threshold for the process of FIG. 9.

FIG. 10 is a flowchart describing an embodiment of a process 1000 for determining an adaptive second threshold $T2_A$ based on FAC for the process of FIG. 9. In an example embodiment, process 1000 is performed on memory die 102 using the one or more control circuits discussed above (see FIG. 1). In other embodiments, other circuits may be used to implement process 1000.

In an embodiment, process 1000 is performed before process 900 commences. At step 1002, a determination is made whether a data write count (DWC) exceeds a predetermined value. For example, in an embodiment control circuitry 106 (FIG. 1) maintains a DWC that keeps track of the quantity of data written to a block of memory cells, and at step 1002 control circuitry 106 may determine if the DWC exceeds the predetermined value (e.g., 72 MB or some other value). If the DWC does not exceed the predetermined value, at step 1004 the PWR process flow (e.g., process 900) continues with the existing value of adaptive second threshold $T2_A$. In other embodiments, P/E cycle counts may be used at step 1002. As used herein, each count of a DWC is equivalent to the size of a block (e.g., 18 MB or some other value) multiplied by one P/E cycle count.

If however the DWC exceeds the predetermined value, at step 1006 a determination is made whether the FAC is greater than a first threshold false alarm count $T_{MAX}$. In embodiments, first threshold false alarm count $T_{MAX}$ specifies a maximum number of false alarms (e.g., 100, or some other value) that trigger adjustment of adaptive second threshold $T2_A$.

If at step 1006 a determination is made that the FAC is greater than first threshold false alarm count $T_{MAX}$, then at step 1008 a determination is made whether adaptive second threshold $T2_A$ has reached a predetermined maximum value $T2_{MAX}$. If at step 1008 a determination is made that adaptive second threshold $T2_A$ has reached predetermined maximum value $T2_{MAX}$, then at step 1004 the PWR process flow (e.g., process 900) continues with the existing value ($T2_{MAX}$) of adaptive second threshold $T2_A$.

If, however, at step 1008 a determination is made that adaptive second threshold $T2_A$ has not reached predetermined maximum value $T2_{MAX}$, then at step 1010 adaptive second threshold $T2_A$ is increased by a first incremental value $\Delta T1$. In embodiments, first incremental value $\Delta T1$ may have a value equal to one least significant bit of a digital-to-analog converter (DAC), or may be some other value.

At step 1012, the DWC and the FAC are both reset to 0, and then at step 1004 the PWR process flow (e.g., process 900) continues with the increased value of adaptive second threshold $T2_A$.

If at step 1006 a determination is made that the FAC is not greater than first threshold false alarm count $T_{MAX}$, then at step 1014 a determination is made whether the FAC is less than a second threshold false alarm count $T_{MIN}$. In embodiments, second threshold false alarm count $T_{MIN}$ specifies a minimum number of false alarms (e.g., 10, or some other value) that trigger adjustment of adaptive second threshold $T2_A$. If the FAC is not less than second threshold false alarm count $T_{MIN}$, at step 1004 the PWR process flow (e.g., process 900) continues with the existing value of adaptive second threshold $T2_A$.

If, however, the FAC is less than second threshold false alarm count $T_{MIN}$, at step 1016 a determination is made whether adaptive second threshold $T2_A$ has reached a predetermined minimum value $T2_{MIN}$. If at step 1016 a determination is made that adaptive second threshold $T2_A$ has reached predetermined minimum value $T2_{MIN}$, then at step 1004 the PWR process flow (e.g., process 900) continues with the existing value ($T2_{MIN}$) of adaptive second threshold $T2_A$.

If, however, at step 1016 a determination is made that adaptive second threshold $T2_A$ has not reached predetermined minimum value $T2_{MIN}$, then at step 1018 adaptive second threshold $T2_A$ is decreased by a second incremental value $4T2$. In embodiments, second incremental value $4T2$ may have a value equal to one least significant bit of a DAC, or may be some other value. In embodiments, second incremental value $4T2$ is equal to first incremental value $\Delta T1$, although in other embodiments first incremental value $\Delta T1$ and second incremental value $4T2$ may have different values.

At step 1012, the DWC and the FAC are both reset to 0, and then at step 1004 the PWR process flow (e.g., process 900) continues with the newly decreased value of adaptive second threshold $T2_A$.

Thus, as described above, one embodiment includes a method that includes performing a post-write read operation on a block of memory cells that includes a select gate transistor, and based on results of the post-write read operation selectively performing a select gate maintenance operation on the select gate transistor.

One embodiment includes an apparatus that includes a memory device including a block of memory cells that includes a select gate transistor, and a post-write read module configured to perform a read operation after a plurality of memory cells in the block of memory cells have been programmed with data, calculate a bit error rate based on results of the read operation, and compare the calculated bit error rate to a first threshold. Based on results of the comparing step, the post-write read module selectively invokes a select gate maintenance module configured to: (a) determine a threshold voltage of the select gate transistor, and (b) selectively program the select gate transistor based on the determined threshold voltage.

One embodiment includes a system including a memory array, a controller, and a post-write read module. The memory array includes a block of memory cells that includes a select gate transistor. The controller is configured to program a plurality of memory cells in the block of memory cells. The post-write read module is configured to read the plurality of programmed memory cells, calculate a bit error rate based on results of the read, and compare the calculated bit error rate to an adaptive threshold. Based on results of the comparing step, the post-write read module selectively invokes a select gate maintenance module configured to: (a) determine a threshold voltage of the select gate transistor, and (b) selectively program the select gate transistor based on the determined threshold voltage.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. A method comprising:
    performing a post-write read operation on a block of memory cells that includes a select gate transistor, wherein the select gate transistor is not used to store user data; and
    based on results of the post-write read operation selectively performing a select gate maintenance operation on the select gate transistor.

2. The method of claim 1, wherein performing the post-write read operation comprises:
    performing a read operation after a plurality of memory cells in the block of memory cells have been programmed with data; and
    calculating a bit error rate based on results of the read operation.

3. The method of claim 2, further comprising:
    comparing the calculated bit error rate to a first threshold; and
    based on results of the comparing step selectively: (a) performing the select gate maintenance operation on the select gate transistor, and (b) continuing to program memory cells in the block of memory cells with data.

4. The method of claim 1, wherein performing a select gate maintenance operation on the select gate transistor comprises:
    determining a threshold voltage of the select gate transistor; and
    selectively retiring the block of memory cells based on the determined threshold voltage.

5. The method of claim 1, wherein performing a select gate maintenance operation on the select gate transistor comprises:
   determining a threshold voltage of the select gate transistor; and
   selectively programming the select gate transistor based on the determined threshold voltage.

6. The method of claim 1, wherein performing the post-write read operation comprises calculating a bit error rate, and the method further comprises:
   (a) comparing the calculated bit error rate to a first threshold;
   (b) comparing the calculated bit error rate to a second threshold;
   (c) based on results of step (b) selectively: (i) performing the select gate maintenance operation on the select gate transistor, and (ii) continuing to program memory cells in the block of memory cells with data.

7. The method of claim 6, wherein the second threshold comprises a fixed value.

8. The method of claim 6, wherein the second threshold comprises an adaptive value.

9. The method of claim 6, wherein the second threshold is less than the first threshold.

10. The method of claim 1, wherein the block of memory cells comprises any of a NAND string of memory cells and a NOR string of memory cells.

11. Apparatus comprising:
    a memory device comprising a block of memory cells that includes a select gate transistor, wherein the select gate transistor is not used to store user data;
    a post-write read module configured to perform a read operation after a plurality of memory cells in the block of memory cells have been programmed with data, calculate a bit error rate based on results of the read operation, and compare the calculated bit error rate to a first threshold,
    wherein based on results of the comparing step, the post-write read module selectively invokes a select gate maintenance module configured to: (a) determine a threshold voltage of the select gate transistor, and (b) selectively program the select gate transistor based on the determined threshold voltage.

12. The apparatus of claim 11, wherein the post-write read module is further configured to compare the calculated bit error rate to a second threshold, and based on results of the second comparison, selectively invoke the select gate maintenance module, and continue to program memory cells in the block of memory cells with data.

13. The apparatus of claim 12, wherein the second threshold comprises a fixed value.

14. The apparatus of claim 12, wherein the second threshold comprises an adaptive value.

15. The apparatus of claim 12, wherein the second threshold is less than the first threshold.

16. The apparatus of claim 11, wherein the block of memory cells comprises any of a NAND string of memory cells and a NOR string of memory cells.

17. A system comprising:
    a memory array comprising a block of memory cells that includes a select gate transistor, wherein the select gate transistor is not used to store user data;
    a controller configured to program a plurality of memory cells in the block of memory cells; and
    a post-write read module configured to read the plurality of programmed memory cells, calculate a bit error rate based on results of the read, and compare the calculated bit error rate to an adaptive threshold,
    wherein based on results of the comparing step, the post-write read module selectively invokes a select gate maintenance module configured to: (a) determine a threshold voltage of the select gate transistor, and (b) selectively program the select gate transistor based on the determined threshold voltage.

18. The system of claim 17, wherein the select gate maintenance module is further configured to increment a false alarm count if the calculated bit error rate is greater than the adaptive threshold, and the determined threshold voltage is not below a first predetermined value and not above a second predetermined value.

19. The system of claim 18, wherein the adaptive threshold comprises a value that is adjusted if the false alarm count exceeds a first threshold false alarm count.

20. The system of claim 17, wherein the memory array comprises any of a NAND string of memory cells and a NOR string of memory cells.

* * * * *